(12) United States Patent
Zilberberg

(10) Patent No.: US 11,705,718 B2
(45) Date of Patent: Jul. 18, 2023

(54) SYSTEM AND METHOD FOR CANCELLING PARASITE VOLTAGE OF NEUTRAL ELECTRIC LINE AND LIFTING OF VOLTAGE OF PHASE LINE AT A REMOTE LOAD

(71) Applicant: David Zilberberg, Herut (IL)

(72) Inventor: David Zilberberg, Herut (IL)

( * ) Notice: Subject to any disclaimer, the term of this patent is extended or adjusted under 35 U.S.C. 154(b) by 417 days.

(21) Appl. No.: 17/142,283

(22) Filed: Jan. 6, 2021

(65) Prior Publication Data

US 2022/0216689 A1 Jul. 7, 2022

(51) Int. Cl.
*H02H 7/04* (2006.01)
*G01R 31/58* (2020.01)
*H02H 7/00* (2006.01)

(52) U.S. Cl.
CPC .............. *H02H 7/04* (2013.01); *G01R 31/58* (2020.01); *H02H 7/005* (2013.01)

(58) Field of Classification Search
CPC ... H02H 7/04; H02H 7/055; H02J 3/12; H02J 3/18

USPC .......................................................... 361/35
See application file for complete search history.

(56) References Cited

U.S. PATENT DOCUMENTS

| | | | |
|---|---|---|---|
| 6,417,651 B1 * | 7/2002 | Kronberg ................. | G05F 1/14 323/255 |
| 2010/0116595 A1 * | 5/2010 | Kang ..................... | H02M 5/12 187/289 |

* cited by examiner

*Primary Examiner* — Danny Nguyen
(74) *Attorney, Agent, or Firm* — Pearl Cohen Zedek Latzer Baratz LLP

(57) ABSTRACT

A device for cancellation of parasitic voltage on the neutral line and for adjusting phase-to-neutral voltage at the remote end of a long power line comprises an autotransformer and at least two single-port-to-multi-port controllable selectors and a controller. The controller is adapted to enable educated selection of taps of the autotransformer by the controllable single-port-to-multi-port controllable selectors, for setting the phase-to-neutral output voltage to nominal voltage and for canceling the parasitic neutral-to-ground voltage.

9 Claims, 19 Drawing Sheets

Equivalent Circuit

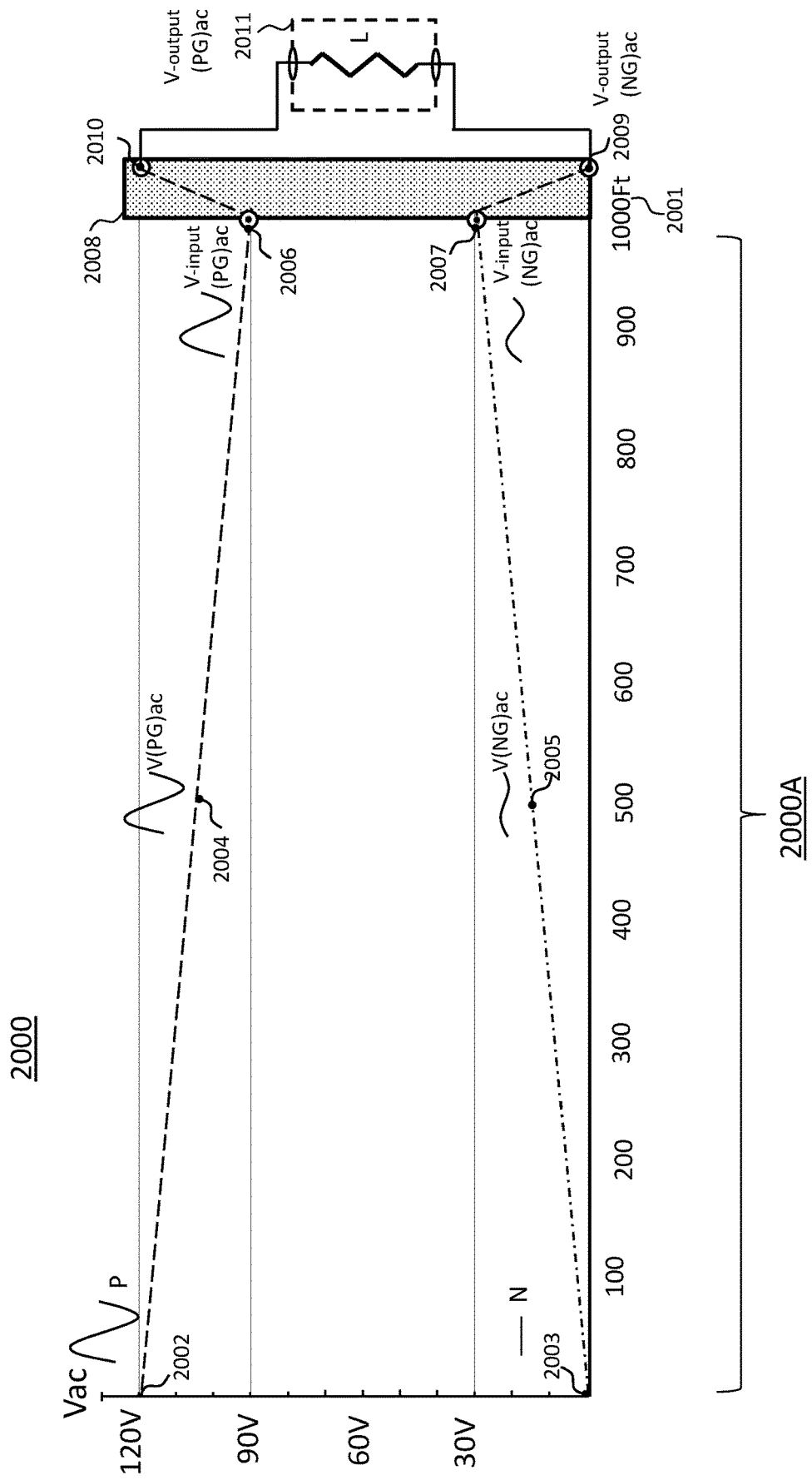

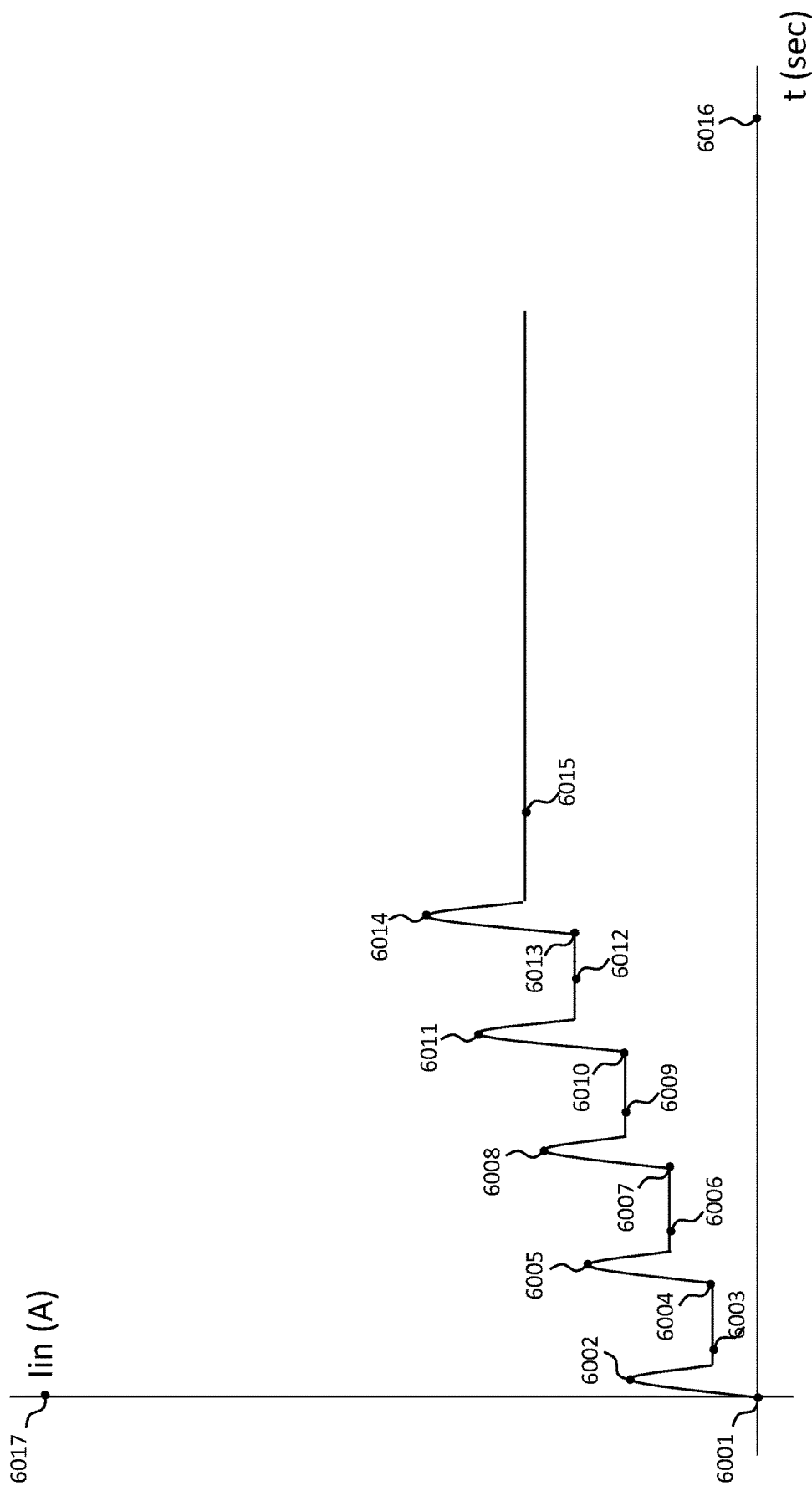

SYSTEM AND METHOD FOR CANCELLING PARASITE VOLTAGE OF NEUTRAL ELECTRIC LINE AND LIFTING OF VOLTAGE OF PHASE LINE AT A REMOTE LOAD

BACKGROUND OF THE INVENTION

Certain electric cabled systems provide power to remote active devices such as outdoor communication devices over long electric cables. For example, optical transmitters and receivers, street WIFI transmitters, LTE micro cell, and the like. In this regard, 'long electric cable' and 'small cross section area' relate to remote single phase powering systems where the current of the provided power through the cable over its entire length of Phase and Neutral wires during nominal operation causes a power line voltage drop (LVD) that exceeds a given allowed voltage drop threshold. As a result, active devices connected at the remote end of a long electric cable may receive power at a too-low voltage. Moreover, the voltage presented to the active device at the remote end of the cable may exhibit, with regard to a reference voltage such as the ground line, a too-low phase voltage and a too-high neutral line voltage due to neutral line stray voltage. CATV regulations forbid using a power supply that exceeds defined level, for example 60V/90 VAC for outdoor communication network or 120 VAC for indoor use, thereby solving the above-mentioned problem by increasing the supply voltage level is not allowed, for example, due to safety reasons.

FIG. 1A shows a schematic illustration of a known system 10 used for providing power over long cable. System 10 comprises a single phase power source 100 connected via long cable 104 to active devices 114. Power source 100 is connected to active device 114 via a phase line/lead, neutral line/lead and a ground line/lead. Active device 114 draws current 111 through a phase line/lead, and the return current through the neutral (AKA zero) line/lead is denoted 112. Long cable 104 extends from line proximal end (LPE) 115 to line distal end (LDE) 117 with a midpoint LMP 116. In the example of FIG. 1A, the current drawn by active device 114 causes voltage drops that may be measured along the line, for example at LMP and at the distal end LDE. A simplified equivalent circuit 20 presents the internal resistance of the phase line as $R_{PHASE\ LINE}$ and that of the neutral line as $R_{NEUTRAL\ LINE}$, where the actual resistance of each of the lines depends on the physical characteristics of the line.

FIG. 1B depicts graph 50 of voltage drops along line 104 (of FIG. 1A). In the example of FIG. 1B, the drawn current causes a voltage drop of 30 VAC between the LPE (terminal 1002) and the LDE (terminal 1006). Assuming a homogeneous longitudinal resistance along the phase line and the neutral line, the voltage drop at midpoint LMP (1004) is 15 VAC. As a result, the phase-to-ground voltage at the active device's phase terminal 1006 is 120−30=90 VAC. Similarly, the parasite voltage on the neutral line between terminal 1003 and terminal 1007 is 30 VAC (assuming that the cross section of the two leads is substantially the same). The voltage drop over the phase line and the parasite voltage over the neutral line set the voltage between active device's 1009 terminals 1006 and 1007 at 90 VAC−30 VAC=60 VAC, that is half the source voltage, a difficulty which needs to be addressed. Further, the voltage between neutral terminal 1007 and the ground line, instead of being maintained as close as possible to zero, is, in the current example, 30 VAC, which presents another difficulty which must be addressed.

Known devices address the first problem of adjusting the voltage between the phase terminal and the neutral terminal of the remote active device back to nominal power voltage, yet, the parasite voltage developing on the neutral line is left untreated, thereby presenting a problem and especially where at least one unit at the remote end of the cable is referenced to ground voltage. This problem is intensified at known solutions because the correction of the phase voltage at the output without handling the parasite voltage of the neutral line not only leaves the output terminals at a voltage gap with respect to the ground line, but also may raise the output phase line to a risky level with respect to the ground because it may be equal to the nominal voltage plus the parasite neutral line voltage. Hence, phase voltage to the ground is higher than the nominal voltage allowed. Autotransformers have the advantages of often being smaller, lighter, and cheaper than typical dual-winding isolated transformers, Other advantages of autotransformers include lower resistance and lower energy losses, and increased VA rating for a given size and mass. The term 'nominal voltage' as used herein relates is a value assigned to a circuit or system to designate its voltage class conveniently (e.g., 120/240 volts, 300 volts, 480Y/277 volts). Thus, a nominal single AC phase power line voltage may be 240 VAC or 120 VAC, depending on the country discussed.

There is a need to enable providing of power voltage at a nominal level at the remote active device, thereby overcoming the disadvantages of the line voltage drop (LVD) and the Isolator transformer, and further to provide the AC power at the active device's terminals with voltage difference between the neutral terminal and the ground terminal close to zero.

SUMMARY OF THE INVENTION

A Phase and Neutral voltage Adjusting (PNVA) device is presented. The PNVA device comprises a phase AC input terminal, neutral line input terminal, ground line input terminal, phase AC output terminal, neutral line output terminal and ground output terminal. The device further comprises an autotransformer which comprises a plurality of taps each connected to a separate winding of the autotransformer and associated with at least one of an AC phase input terminal of the device and with an AC phase output of the device, and a plurality of taps each connected to a separate winding of the autotransformer and associated with at least one of an AC neutral line input terminal of the device and with an AC neutral line output of the device. The device further comprises at least one first single-port-to Multi-port (STMS) controllable selector switch associated with adjusting the AC phase output voltage, at least one second single-port-to multi-port (STMS) controllable selector switch associated with adjusting the neutral output voltage and a controller adapted to provide control signals for activating each of the at least one STMS of the AC phase output and the at least one STMS associated with the neutral output. Each of the at least one first STMS and at least one of the second STMS is adapted to connect the respective single port to a selected respective port of the multiple ports in response to a control signal from a controller.

In some embodiments, the controller is configured to respond to a signal indicative of the voltage between the AC phase input terminal and the neutral line input terminal and to respond to a signal indicative of the voltage between the neutral line input terminal and the ground output terminal.

In some embodiments, the controller is further configured to issue a first control signal to the at least one first STMS in response to the signal indicative of the voltage between the AC phase input terminal and the neutral line input terminal and to issue a second control signal to the at least one second STMS in response to the voltage between the neutral line input terminal and the ground output terminal.

In some embodiments, the first control signal is configured to select one of the multi ports of the at least one first STMS to be connected to the respective single port and the second control signal is configured to select one of the multi ports of the at least one second STMS to be connected to the respective single port.

In some embodiments, the single port of the one of the at least one first STMS is connected to the phase AC input terminal and the respective multi ports are each connected to one tap of the plurality of taps of the autotransformer, the single port of the one of the at least one second STMS is connected to the neutral line input terminal, and the respective multi ports are each connected to one tap of the plurality of taps of the autotransformer, and each of the taps connected to the second STMS is different from the taps connected to the first STMS.

In some embodiments, the one port of the multi ports of the at least one second STMS is selected to set the voltage between the neutral line output port and the ground output port to substantially zero, and the one port of the multi ports of the at least one first STMS is selected to set the voltage between the AC phase output port and the neutral line output port to a nominal line voltage.

A method for canceling parasite voltage on neutral electric line and lifting of voltage of phase line a remote load is presented, the method comprising providing a Phase and Neutral Voltage Adjusting (PNVA) device comprising a phase AC input terminal, a neutral line input terminal, a ground input terminal phase AC output terminal, a neutral line output terminal and a ground output terminal, the device further comprising: an autotransformer, at least one first single-port-to multi-port (STMS) controllable selector switch associated with adjusting the AC phase output voltage, at least one second single-port-to multi-port (STMS) controllable selector switch associated with adjusting the neutral output voltage and a controller adapted to provide control signals for activating each of the at least one STMS of the phase AC output and the at least one STMS associated with the neutral output. The method further comprises issuing a first control signal to the at least one first STMS in response to the signal indicative of the voltage between the phase AC input terminal and the neutral line input terminal and issuing a second control signal to the at least one second STMS in response to the voltage between the neutral line input terminal and the ground input terminal as long the ground is connected.

In some embodiments, the method further comprises selecting one of the multi ports of the at least one first STMS, in response to the first control signal, to be connected to the respective single port and selecting one of the multi ports of the at least one second STMS, in response to the second control signal, to be connected to the respective single port.

In some embodiments, the one port of the multi ports of the at least one second STMS is selected to set the voltage between the neutral line output port and the ground output port to substantially zero and the one port of the multi ports of the at least one first STMS is selected to set the voltage between the AC phase output port and the neutral line output port to a nominal line voltage.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2A is a graph depicting the way a Phase and Neutral Voltage Adjusting (PNVA) device addresses voltage drops on a long phase line and the parasite voltage on long neutral line at a remote end of the line, according to embodiments of the present invention;

FIG. 6B is a graph depicting the source current during gradual connection of the active devices of serially connected PNVAs of FIG. 6A, according to embodiments of the present invention.

Figure 1A:
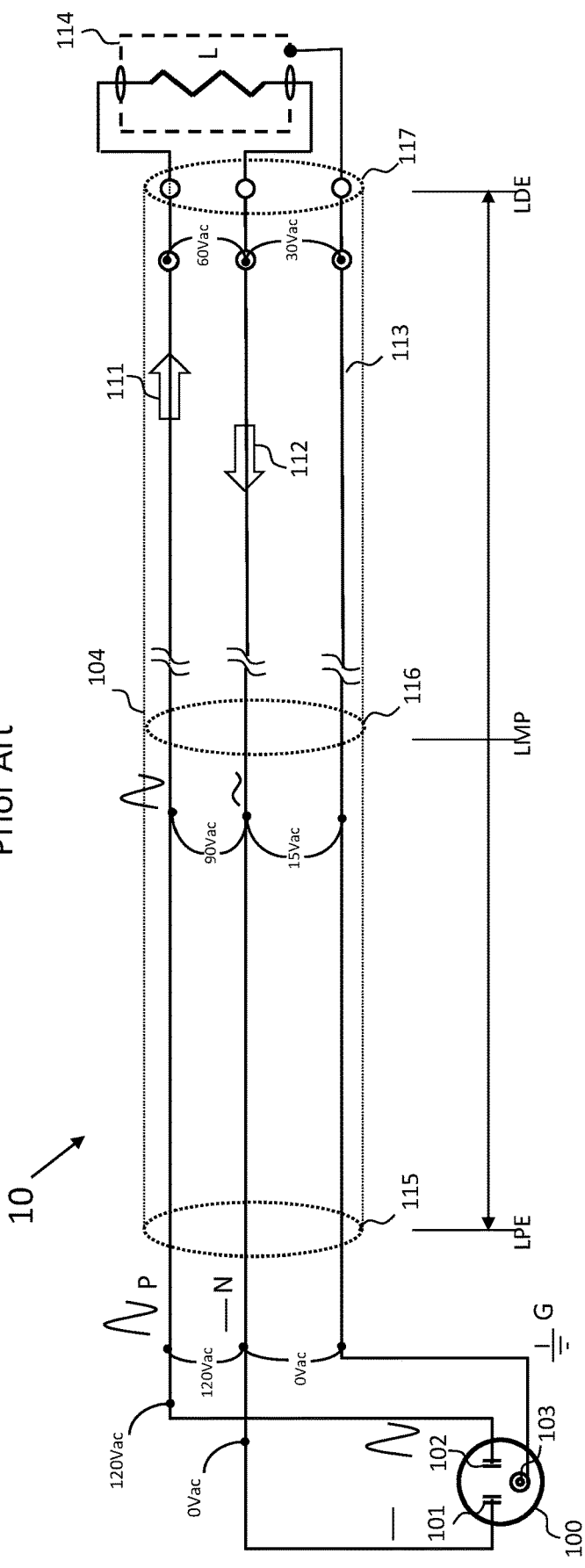
FIG. 1A is a schematic illustration of a known system providing power over long electric cable.
Figure 1A:
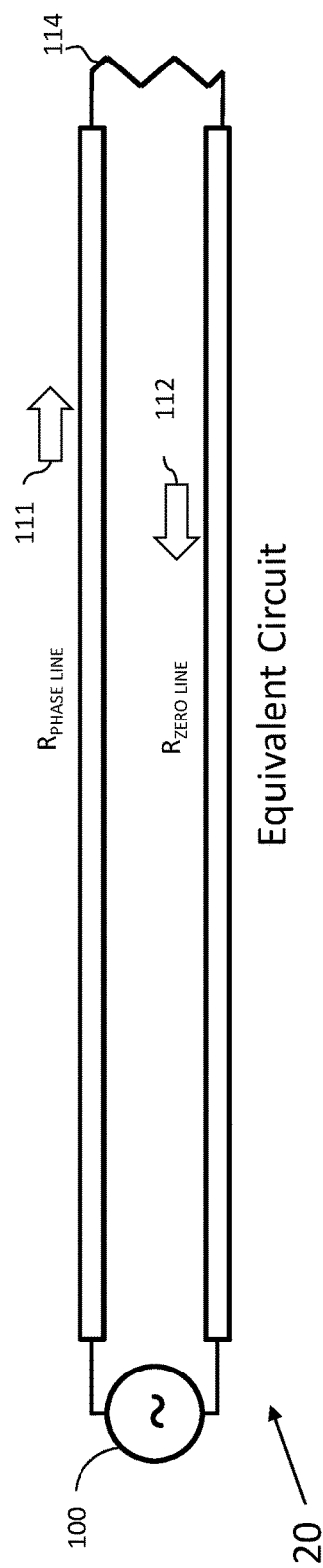

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to embodiments of the present invention, a single controlled autotransformer may be used for adjusting the phase line voltage level and eliminating the parasite stray voltage over the neutral line simultaneously at the active device's input terminal connected at a remote end of a line so that the input AC phase and neutral levels conform with the required nominal voltages, and the voltage difference between the neutral terminal of the active device's device and a ground line is kept within a defined voltage difference, preferably that close to zero Vac.

Figure 1B:
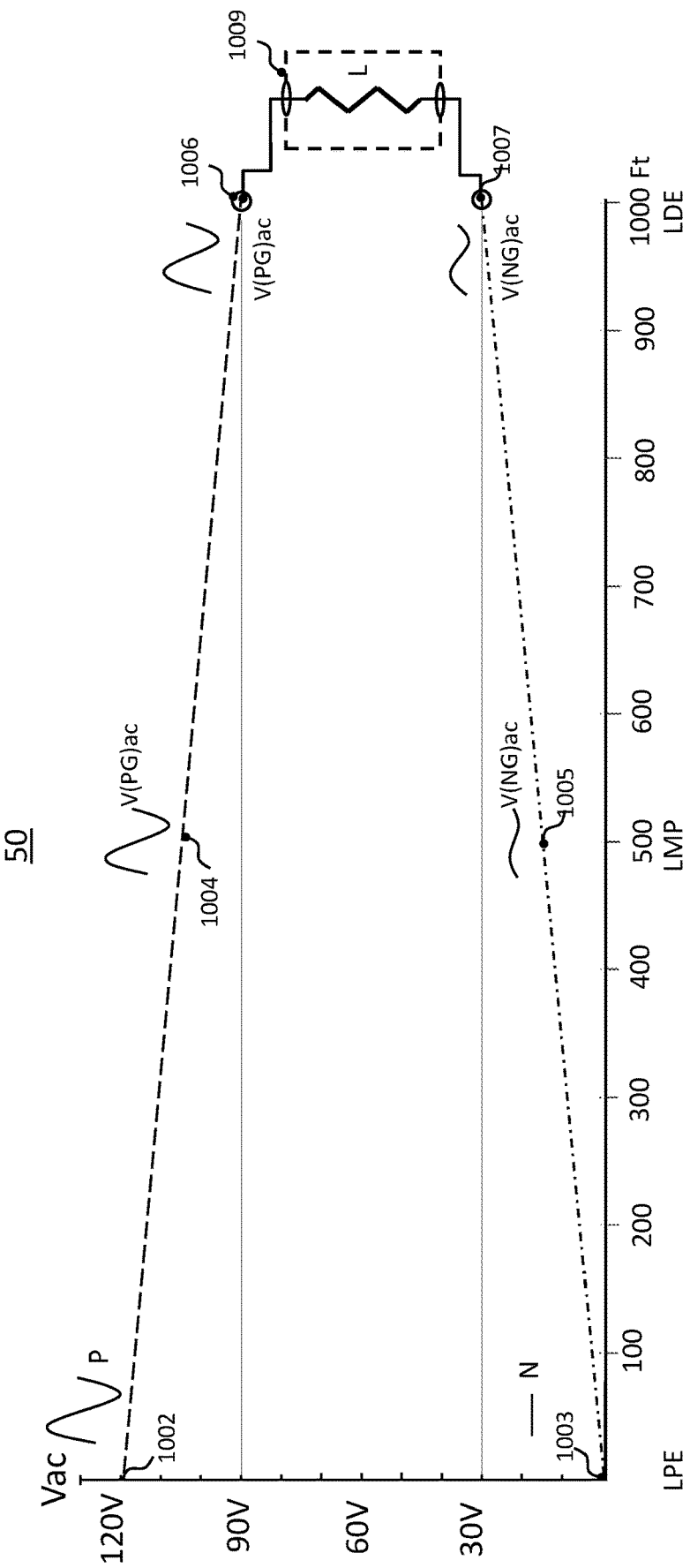
FIG. 1B is a schematic voltage diagram depicting the voltage drop along an electric cable of a known system.

Reference is made to FIG. 2A, which is a graph 2000 depicting the way a phase and neutral voltage adjusting (PNVA) device 2008 addresses voltage drops on a long line at a remote end of the line, according to embodiments of the present invention. Section 2000A of graph 2000 presents the schematic linear voltage drop along a 1000 feet line, similar to the description of the line voltage drop of FIG. 1B. As seen in graph 2000, due to the current drawn by active device 2011, the voltage between PNVA 2008 input terminals 2006 and 2007 drops from 120 VAC to 60 VAC. Further, the voltage at terminal 2007, is 30 VAC higher than the voltage at terminal 2003, the neutral line terminal of the power source. As will be explained in detail hereinbelow, PNVA device 2008 provides means for correcting the voltage drops on the phase line and for eliminating the parasite voltage on the neutral by lifting the voltage of the phase line at terminal 2010 back to nominal voltage and by lowering the voltage of the neutral terminal 2009 down to close to 0 VAC.

Figure 2B:
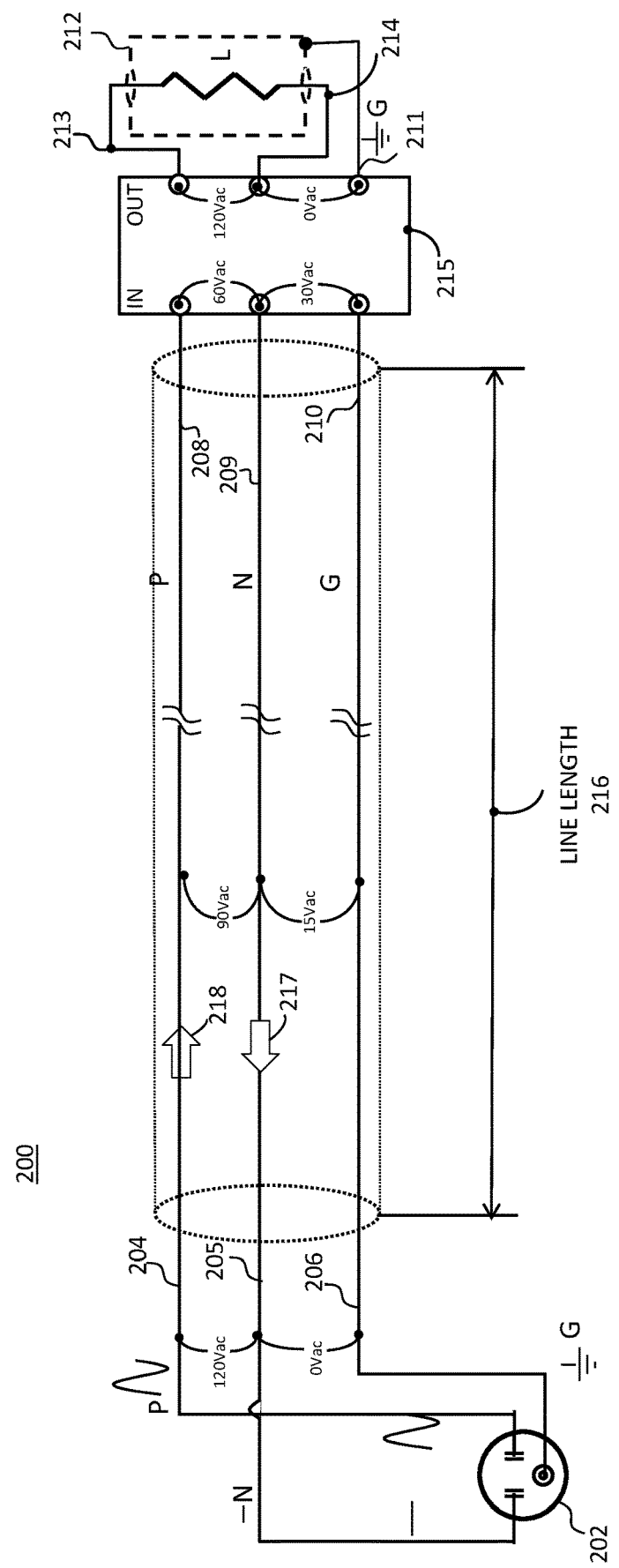
FIG. 2B is a schematic illustration of a system for providing single phase AC regulated power via long line to a load separately to the phase line and the neutral line, according to embodiments of the invention.

Reference is made to FIG. 2B, which is a schematic illustration of system 200 for providing single phase AC regulated power via long line 216 to active device 212, separately to the phase line and the neutral line, according to embodiments of the invention. Single phase AC power source 202 provides AC source power over phase line 204, neutral line 205 and ground line 206 and further provides continuous ground connection to remote active device 212. As explained with respect to FIG. 2A, due to load current 218 (in the phase line) and return load current 217 (in the neutral line), the distal phase voltage 208 to distal neutral AC voltage 209 measured is lower than the phase AC voltage 204 to the neutral AC voltage 205 measured next to the power source 202. Similarly, the voltage between neutral line voltage 209 to ground AC voltage 210 at the distal terminal is higher than the voltage between the neutral line 205 to ground voltage 206 at the power source, and, therefore, it is higher than the voltage of the ground line at the terminals of the remote load. PNVA 215 may receive the AC voltage of the distal end (208,209,210) of line 216 and may be configured to regulate it so that the voltage output between phase port 213 and neutral output port 214 substantially equals the AC source voltage 202 and the voltage between the neutral output port 214 and the ground line (or another reference line, as the case may be) substantially close to zero level. PNVA 215 may equal PNVA 2008 of FIG. 2A.

Figure 2C:
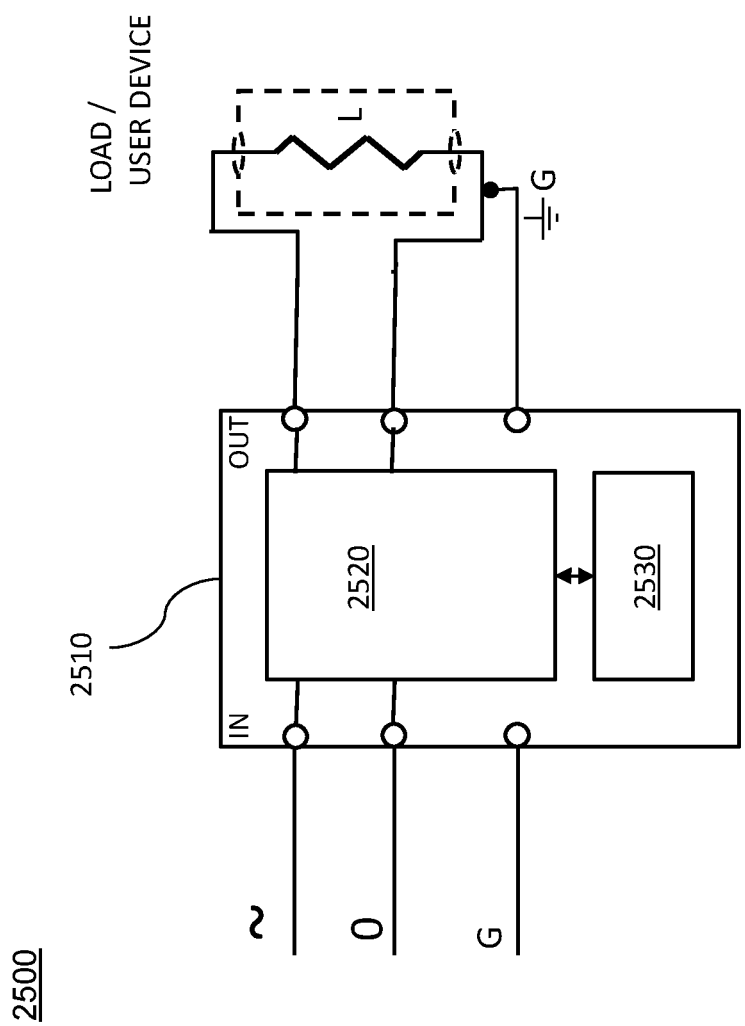
FIG. 2C which is a schematic high-level block diagram of a PNVA, according to embodiments of the present invention.

Reference is made now to FIG. 2C, which is a schematic high-level block diagram of PNVA 2510, according to embodiments of the present invention. PNVA 2510 may comprise a Single-port-To-Multiport Selector (STMS) switch 2520 and a control unit 2530. STMS switch 2520 may be any known means for controllably connecting a single port to a selected one of several ports. STMS switch 2520 may be adapted to perform switching of the power provided by a long line (e.g., line 216 of FIG. 2B). For example, STMS switch 2520 may comprise a controllable rotary switch adapted to controllably connect its mid-port to one of the selectable other ports. Another optional embodiment may employ a dry-contact or a solid state switch for connecting/disconnecting one of the multiple ports to the single port. In the following exemplary embodiments hereinbelow, STMS switches will be depicted as an embodiment of multiple controllable switches with single in and single out ports.

Control unit 2530 may be any known controller, a programmable logic controller (PLC) or any other control unit that is adapted to provide switching signals to STMS switch 2520 in order to select one of the multiple ports for connection to the single port in response to one or more inputs received by control unit 2530. Control unit 2530 may comprise a memory unit, data storage unit, input and output modules and the like, adapted to enable control unit 2530 to perform the functions described herein. In some embodiments, PNVA 2510 may comprise network connectivity capabilities, for example wireless connectivity to remote PNVAs and/or to a central control unit. In some embodiments, network connectivity may be performed over electric power wired line, e.g., line 216 (of FIG. 2B) as is known in the art. In some embodiments, control unit 2530 may be adapted to receive signals indicative of the voltage(s) along the line (such as line 216 of FIG. 2B).

Figure 2D:
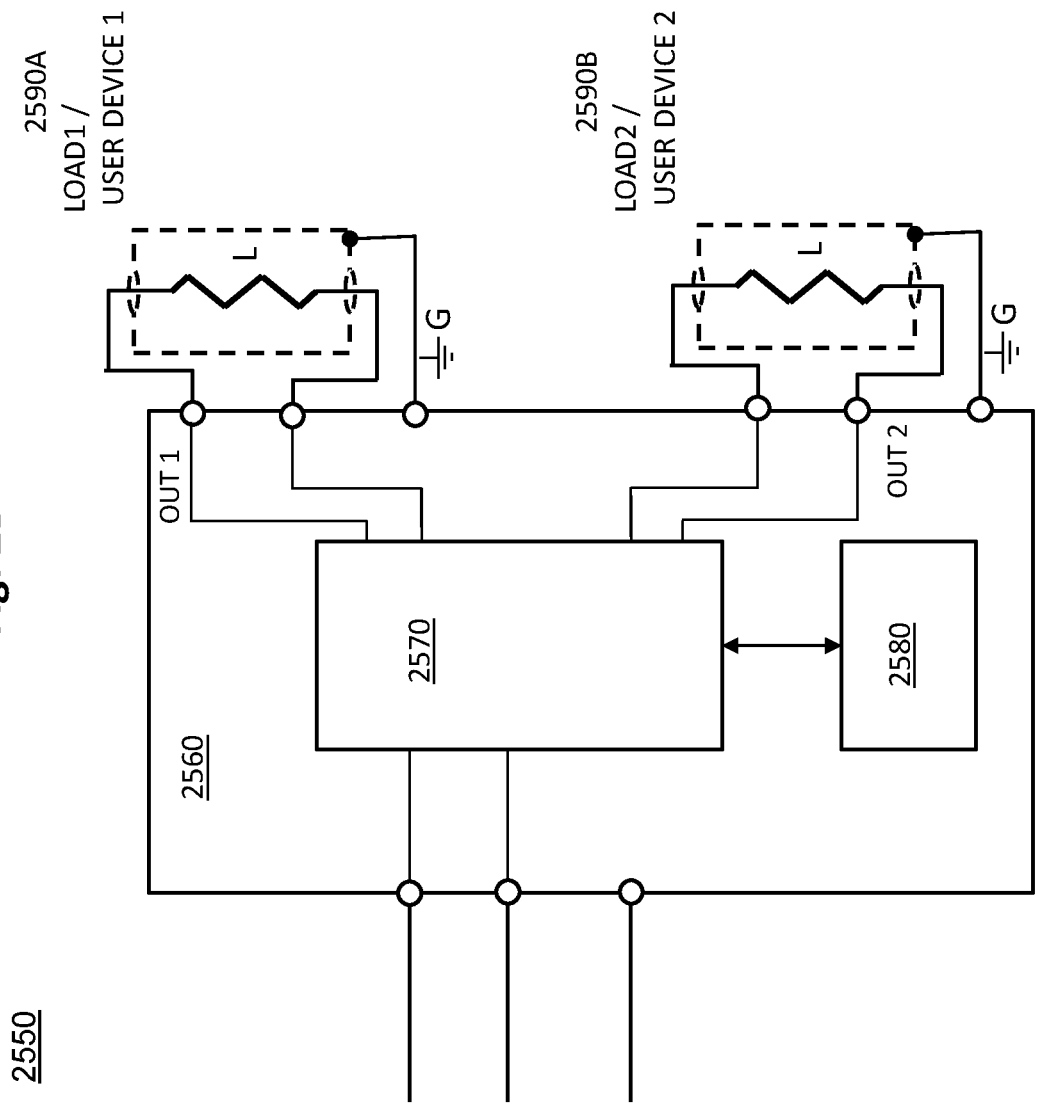
FIG. 2D is a schematic high-level block diagram of a PNVA, according to embodiments of the present invention adapted to power two active devices.

Reference is made now to FIG. 2D, which is a schematic high-level block diagram of PNVA 2560, according to embodiments of the present invention. PNVA 2560 may have similar functionalities and may comprise similar units and modules as PNVA 2510, with a capability to control the power voltage levels of more than a single active device. PNVA 2560 may regulate phase and neutral voltages of two or more active devices, such as active devices 2590A and 2590B, similarly to STMS 2510. PNVA 2560 may comprise two or more STMS switch 2570 (the exact number is derived from the number of serviced active devices). Each of STMS 2570 may be built and function similar to STMS 2520 of FIG. 2C. PNVA 2560 may further comprise control unit 2580 that may be built and may function similar to control unit 2530, with the exception of being capable of controlling two or more PNVAs independently.

Figure 2E:
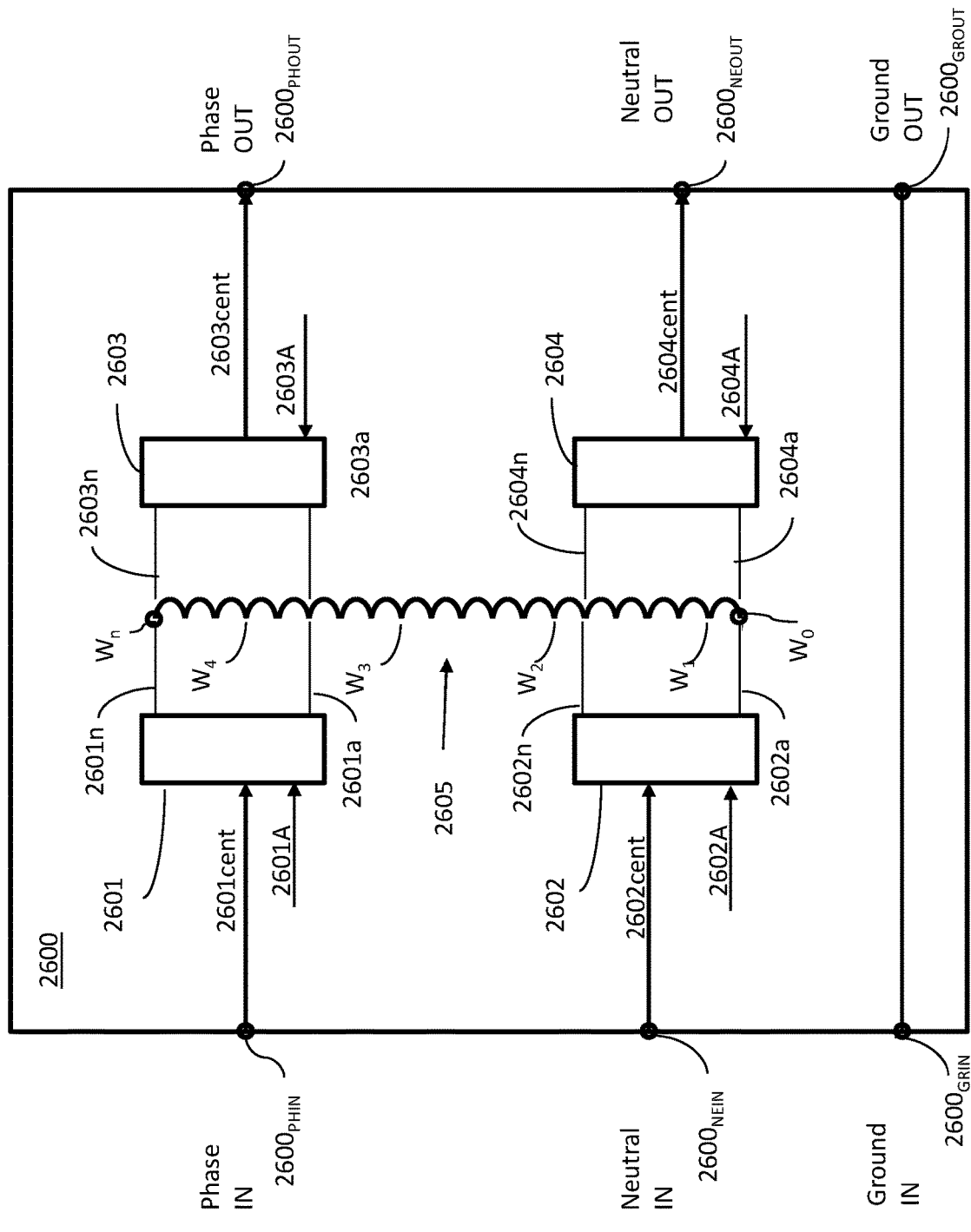
FIG. 2E is a schematic block diagram of a PNVA, comprising an autotransformer, according to embodiments of the present invention.

Reference is made now to FIG. 2E, which is a schematic block diagram of PNVA device 2600, comprising autotransformer 2605, according to embodiments of the present invention. PNVA 2600 comprises autotransformer 2605 comprising n windings.

As is known in the art, an autotransformer is an electrical transformer with only one winding, where portions of the same winding act as both the primary winding and secondary winding sides of the transformer. The autotransformer winding has at least four switched taps, two switched taps (for connecting the preferred phase connection and two switched taps for connecting the preferred neutral connection) where electrical connections are made. Since an autotransformer has only one winding, it has the advantages of being more energy efficient, smaller, lighter, and cheaper than typical dual-winding and isolated transformers. Other advantages of autotransformers include lower leakage resistance, lower losses, lower excitation current, and increased VA rating for a given size and mass. In an autotransformer, the ratio of the secondary voltage to the primary voltage is determined as the relation between the number of secondary windings to the number of primary windings, where the primary and secondary may share at least some of the windings. The entire winding of the autotransformer may be considered as a 'voltage distributor' in which the voltage between any two taps of the transformer is expressed by the equation:

$$V_{T2-T1} = V_{TIN1-TIN2}\left(\frac{n_{T2-T1}}{n_{TIN1-TIN2}}\right) \qquad \text{Eq. 1}$$

Where:

$V_{T2-T1}$ is the voltage between the two output taps T1 and T2

$V_{TIN1-TIN2}$ is the input voltage connected to input taps IN1 and IN2

$n_{T2-T1}$ is the number of windings between the two output taps T1 and T2, and $n_{TIN1-TIN2}$ is the number of windings between the input taps IN1 and IN2

The voltage determined by Eq. 1 is a vector number, meaning that, if an output tap is connected to a winding that is closer to the first winding than winding of an input tape, then the voltage developing on the output tap will be lower than the voltage at the input tap.

PNVA 2600 may comprise at least two STMS, such as STMS 2601, 2602, 2603 and 2604. At least two STMSs may be sufficient for regulating the output voltages $2600_{PHOUT}$ and $2600_{NUOUT}$ so as to bring these voltage to nominal levels, as described above, when AC voltage between the phase input port $2600_{PHIN}$ and the neutral input $2600_{NEIN}$ is lower than the preset nominal voltage and when the voltage between neutral input port $2600_{NEIN}$ and the ground $2600_{GRIN}$ is higher than the nominal voltage with respect to a reference voltage (e.g., ground line), as explained above.

Or, in case port $2600_{GRIN}$ is not connected to the ground and the AC voltage between the input port $2600_{PHIN}$ and the input $2600_{NEIN}$ is lower than the nominal voltage by a measured voltage difference, STMS may be set to enable the voltage between Phase output port $2600_{PHOUT}$ and Neutral output port $2600_{PHOUT}$ to equal the preset nominal level, for example by raising the voltage of Phase output port $2600_{PHOUT}$ by half the measured difference and by decreasing the voltage of Neutral output port $2600_{NEOUT}$ by half the measured difference.

Each of the PNVAs may have a central port (single port), such as port $2601_{CENT}$, for PNVA 2601 and multiple selectable ports, such as ports 2601a-2601n for PNVA 2601. Each STMS may be configured to connect one selected port out of the multiple selectable ports (e.g., ports 2601a-2601n) to central port (e.g., $2601_{CENT}$). Each of the multiple selectable ports (e.g., ports 2601a-2601n) may be connected to a selected winding of autotransformer 2605. STMS, such as STMS 2600, and may be controlled by a control signal provided at control port, such as port 2601A. A control signal provided at control port 2601A may cause STMS 2601 to connect a selected port of the plurality of selectable ports 2601a-2601n to central port $2601_{CENT}$ and to thereby connect that selected port to the central port.

In embodiments using two STMSs, at least one STMS may be used to regulate the output phase voltage, and at least one STMS may be used to regulate the output neutral voltage. Each of the two STMSs may be connected as a selecting device at the primary side or at the secondary side of autotransformer 2605. Since an autotransformer has only a single winding, to the taps of the autotransformer both the input terminals and the output terminals are connected. By convention, the windings connected between the input terminals are named 'primary', and the windings that are connected to the output terminals are named 'secondary'. At least some of the primary windings may also be secondary windings. The input or output ports that are not connected via a STMS device are connected directly to a pre-selected winding of autotransformer 2605.

Figure 3A:
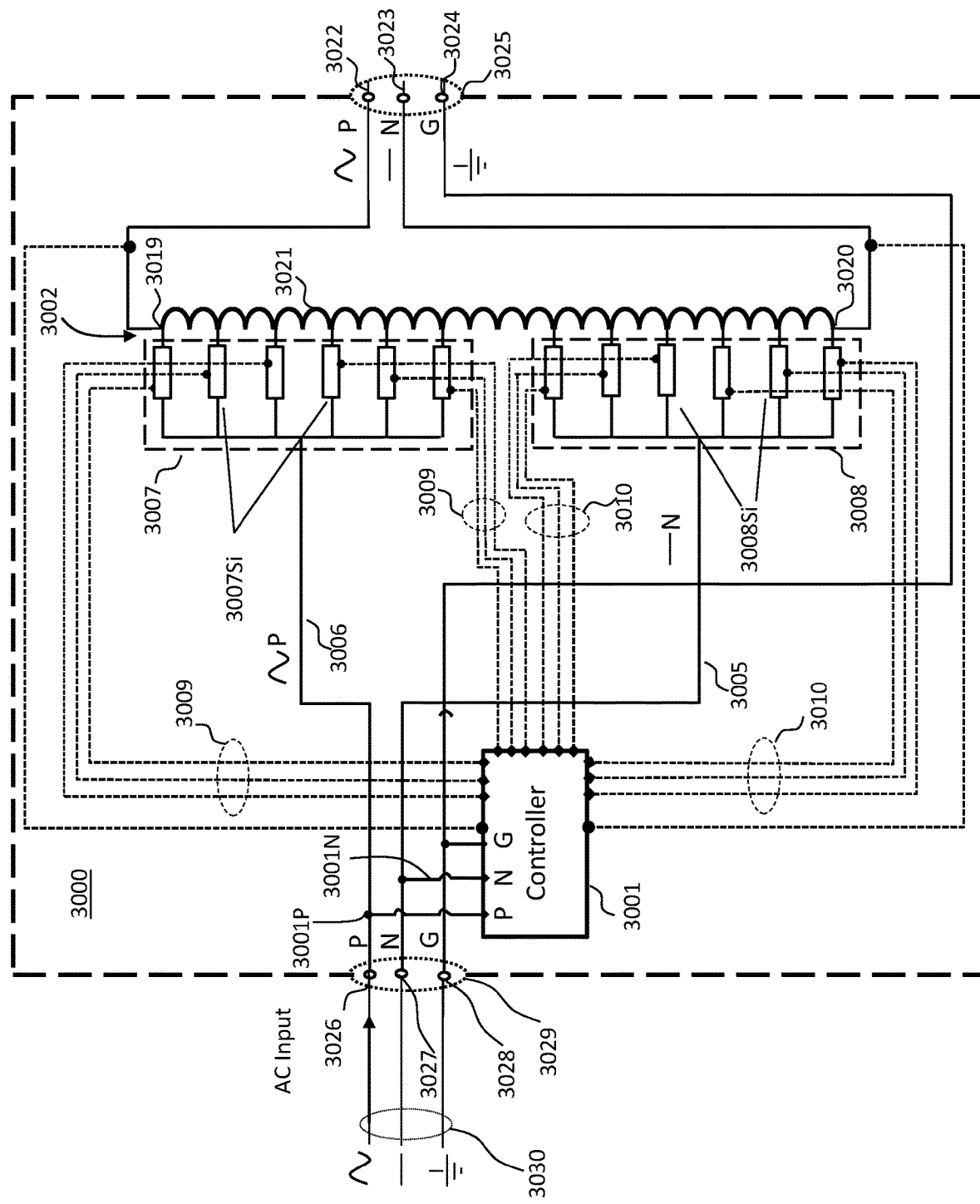
FIG. 3A is a schematic illustration of a PNVA according to embodiments of the present invention.

Reference is made now to FIG. 3A, which is a schematic illustration of PNVA 3000 according to embodiments of the present invention. PNVA 3000 may comprise autotransformer 3002, control unit 3001, and two STMSs 3007 and 3008. The embodiment depicted in FIG. 3A demonstrates use of two STMSs connected to the primary side of autotransformer 3002. PNVA 3000 may receive single phase AC power at the distal end of a long line (3030) at its input port 3029 via phase terminal 3026 and neutral terminal 3027, and ground may further be connected to the terminal 3028. Output port 3025 of PNVA 3000 comprises phase output terminal 3022, neutral output terminal 3023 and the ground output terminal 3024. Ground output terminal 3024 may be connected directly to the input ground terminal. Output phase terminal 3022 may be permanently connected to 'high' end winding 3019 of autotransformer 3002, located at the distal end from winding 3020, to which output neutral pin 3023 may permanently be connected.

STMS 3008 may be connected at its central port to input neutral line 3005 and may selectively be connected to one of its plurality of selectable ports 3008a-3008n. Each of the selectable ports of STMS 3008 may be connected, via switches 3008Si, to a predefined winding. All of the windings connectable via STMS 3008 are selected closer to first end winding 3020 than the windings connectable via STMS 3007.

STMS 3007 may be connected at its central port to input phase line 3006 and may selectively be connected to one of its plurality of selectable ports 3007a-3007n. Each of the selectable ports of STMS 3007 may be connected, via a respect switch 3007Si, to a predefined winding. All of the windings connectable via STMS 3007 are selected closer to the second end winding 3020 than the windings connectable via STMS 3008.

Each of switches 3007Si and 3008Si may be controlled to switch open or close via control bus 3009 or 3010, respectively, which are connected to control unit 3001. Control unit 3001 may receive input signals indicative of the voltage of input phase line 3001P, input neutral line 3001N and input ground 3001G. Control unit 3001 may further be in operational communication with one or more other PNVAs and/or with a remote central control unit (not shown).

Figure 3B:
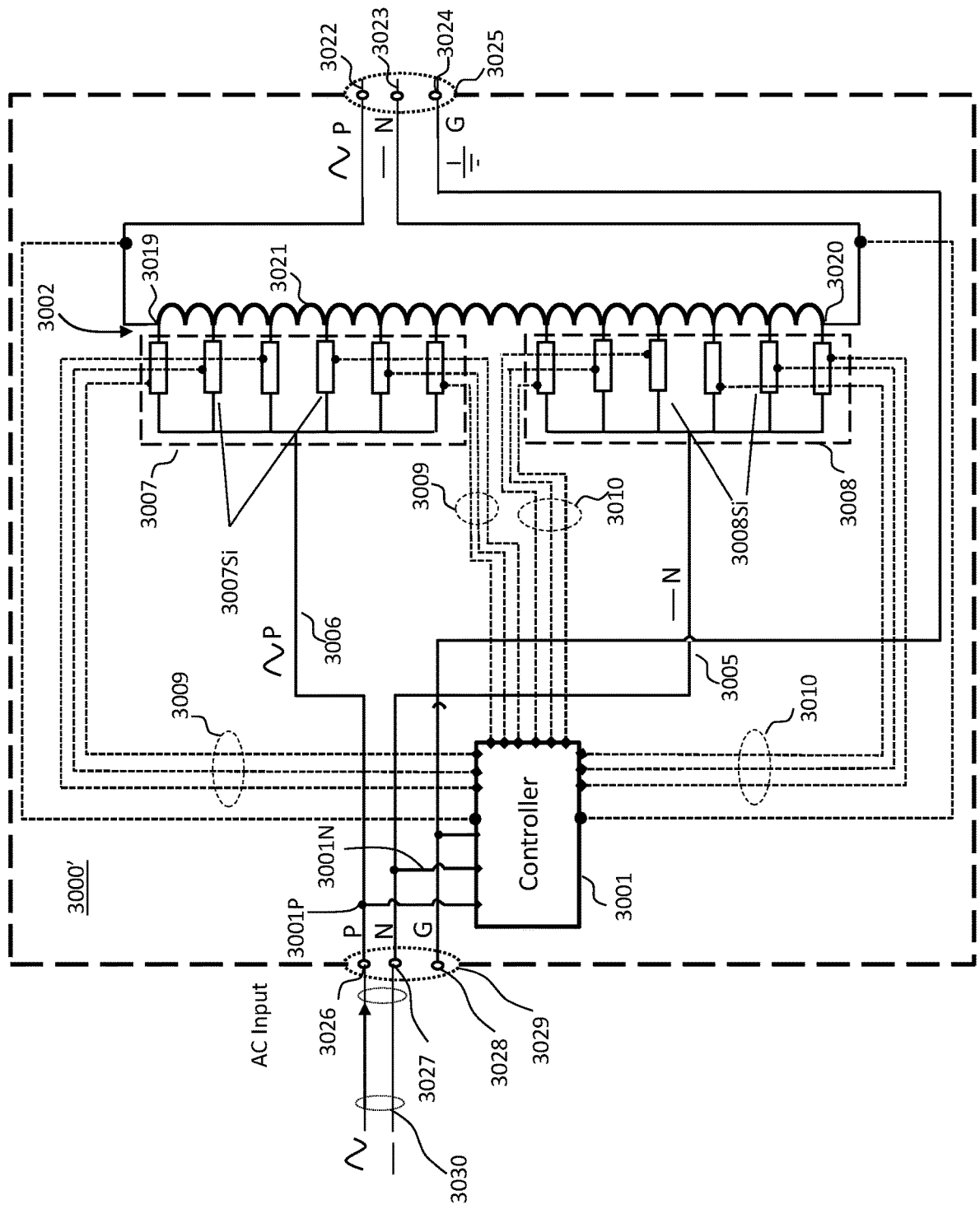
FIG. 3B is a schematic illustration of a the of FIG. 3A without a ground connection to the ground input terminal, according to embodiments of the present invention.

Reference is made now also to FIG. 3B, which is a schematic illustration of PNVA 3000', according to embodiments of the present invention. PNVA 3000' may be similar or the same as PNVA 3000, where the embodiment of FIG. 3B demonstrates use of a PNVA, such as PNVA 3000 when no ground line is connected at the input ground terminal 3028 or at output ground terminal 3024. In such a case, controller 3001 may sense that the input ground terminal 3028 is floating (not connected). Absent a reference ground voltage, controller 3001 may act according to the assumption that the phase voltage drop magnitude equals the neutral parasitic voltage. Accordingly, controller 3001 may set STMS 3007 to raise output phase voltage at terminal 3022 by half the difference between nominal phase-to-neutral voltage level and the phase-to-neutral voltage measured at the input of PNVA 3000, and may set STMS 3008 to be lowered by the same magnitude, thereby setting the output neutral voltage at terminal 3023 to as close as possible to a ground voltage level and setting the voltage difference between output phase terminal 3022 and output neutral terminal 3023 the nominal phase to neutral voltage level. For example, if the phase-to-neutral voltage measured at the input of PNVA 3000 is 90 VAC and the nominal phase-to-neutral voltage level is 120 VAC, STMS 3007 my raise output phase voltage at terminal 3022 by (120−90)/2=30 VAC. Similarly, STMS 3008 may lower the phase-to-neutral voltage by 30 VAC.

Figure 3C:
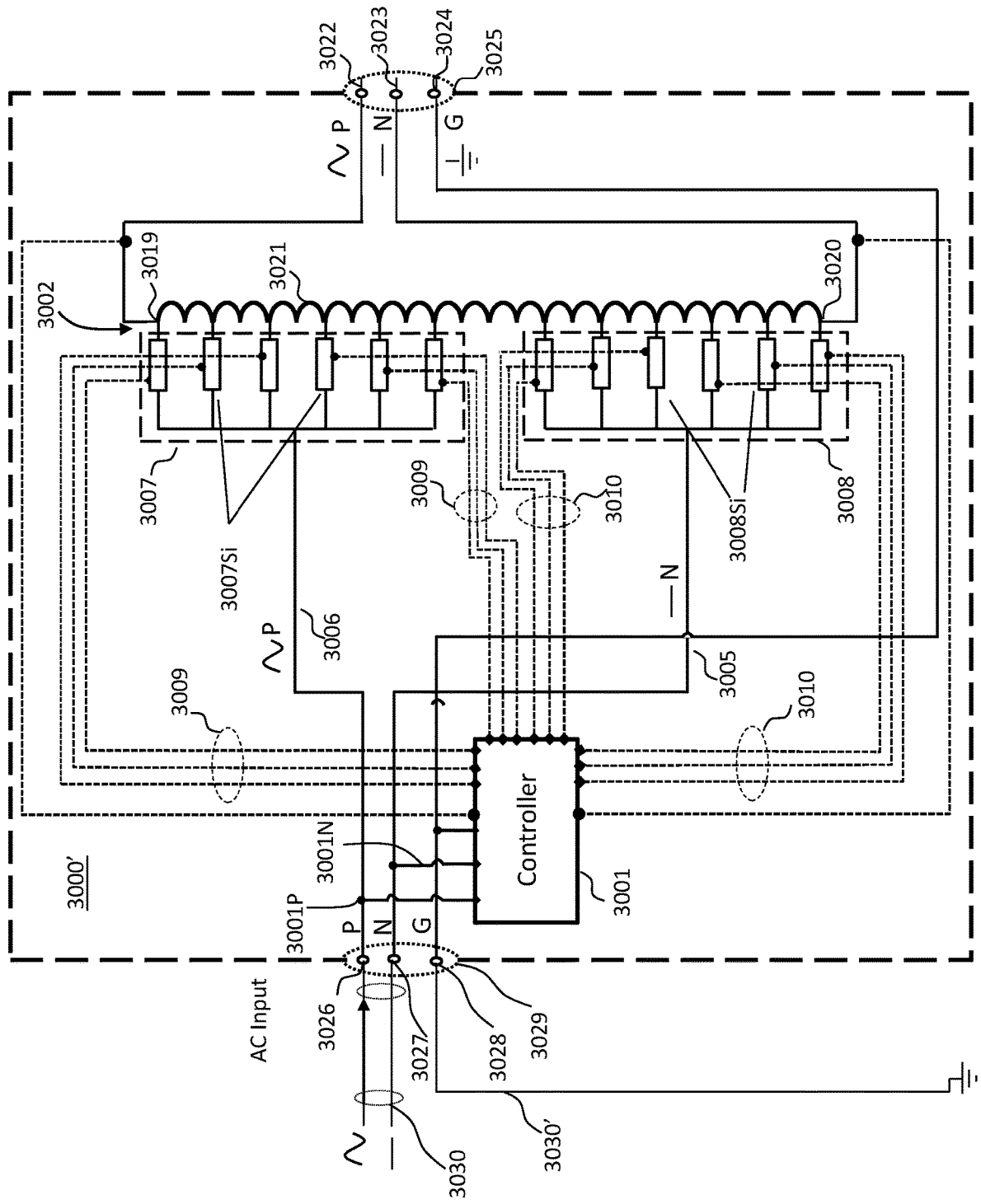
FIG. 3C is a schematic illustration of a the of FIG. 3A with a local ground connection to the ground input terminal, according to embodiments of the present invention.

Reference is made now also to FIG. 3C, which is a schematic illustration of PNVA 3000', according to embodiments of the present invention. PNVA 3000' may be similar or the same as PNVA 3000, differing from PNVA 3000 by having local ground connection by ground line 3030' connected at the ground input terminal 3028. This embodiment is typical for power lines having only two wires, such as coaxial lines.

Figure 4A:
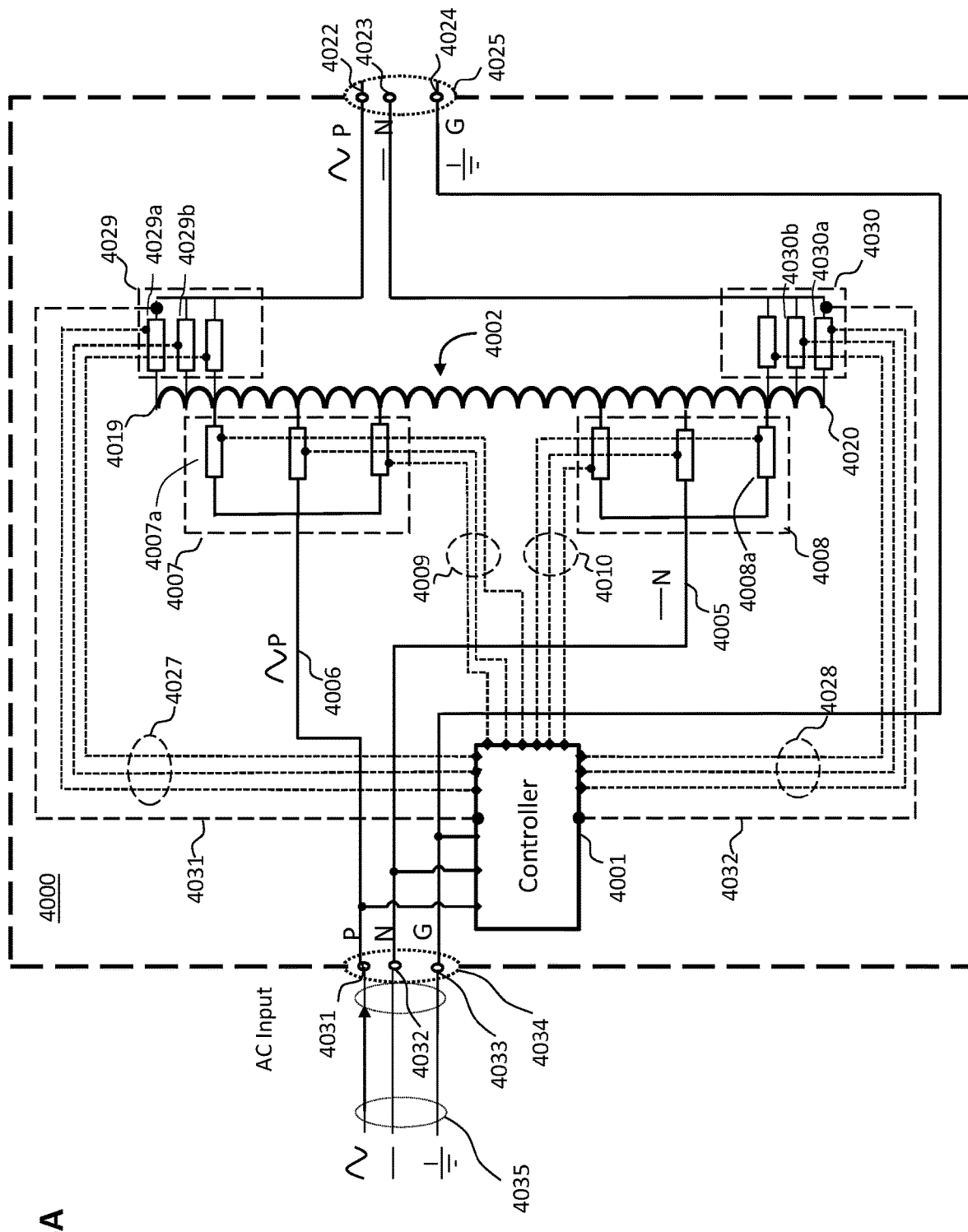
FIG. 4A is a schematic illustration of another PNVA, according to embodiments of the present invention.

Reference is made now also to FIG. 4A, which is a schematic illustration of PNVA 4000, according to embodiments of the present invention. PNVA 4000 may comprise autotransformer 4002, control unit 4001, and two STMSs 4007 and 4008 connected to the primary side of autotransformer 4002, similar to STMSs 3007 and 3008 of FIG. 3A. PNVA 4000 further comprises STMSs 4029 and 4030 connected at the secondary side of autotransformer 4002. STMSs 4007, 4008, 4029 and 4030 are controllable by control unit 4001 via control buses 4009, 4010, 4027, 4028, respectively.

The embodiment depicted in FIG. 4A demonstrates the use of two STMSs connected on the primary side of autotransformer 4002. Different from PNVA 3000, PNVA 4000 demonstrates the use of four STMSs: STMS 4007 and 4008 connected at the primary side of autotransformer 4002, and STMS 4029 and 4030 connected at the secondary side of autotransformer 4002. The embodiment of FIG. 4A depicts optional connection of STMS 4029 via at least some of its selectable connections 4029a, 4029b to the windings having voltage higher than the voltage at winding 4007a, which provides the highest voltage connectable to STMS 4007. Similarly, STMS 4030 may optionally be connected to at least some winding via switches 4030a, 4030b having voltage lower than the voltage at winding 4008a, which present the lowest voltage via STMS 4008. PNVA 4000 may receive single phase AC power at the distal end of a long line (not shown) at its input port 4034 via phase terminal 4031 and neutral terminal 4032, and may further be connected to the ground terminal 4033. Output port 4025 of PNVA 4000 comprises phase output terminal 4022, neutral output terminal 4023 and ground output terminal 4024. Ground output terminal 4024 may be connected directly to the input ground terminal 4033. Output phase terminal 4022 may be connected through STMS 4029 to one of several selectable windings tap of autotransformer 4002. Output neutral pin 4023 may be connected through STMS 4030 to one of several selectable windings tap of autotransformer 4002. The embodiment depicted in FIG. 4A presents a high level of flexibility in regulating the output phase and neutral voltages, by enabling multiple options composed of the number of selectable windings of all of the STMSs of PNVA 4000. Control unit 4001 may receive an indication of the voltages between input phase terminal 4031 and input neutral terminal 4032 and of the voltage between neutral terminal 4032 and the ground terminal 4033 in order to determine the right selection of windings in at least some of STMSs 4007, 4008, 4029 and 4030. In some embodiments, the control unit 4001 may also receive an indication of the output phase and neutral voltages in order to perform closed loop control of the voltage regulation.

Figure 4B:
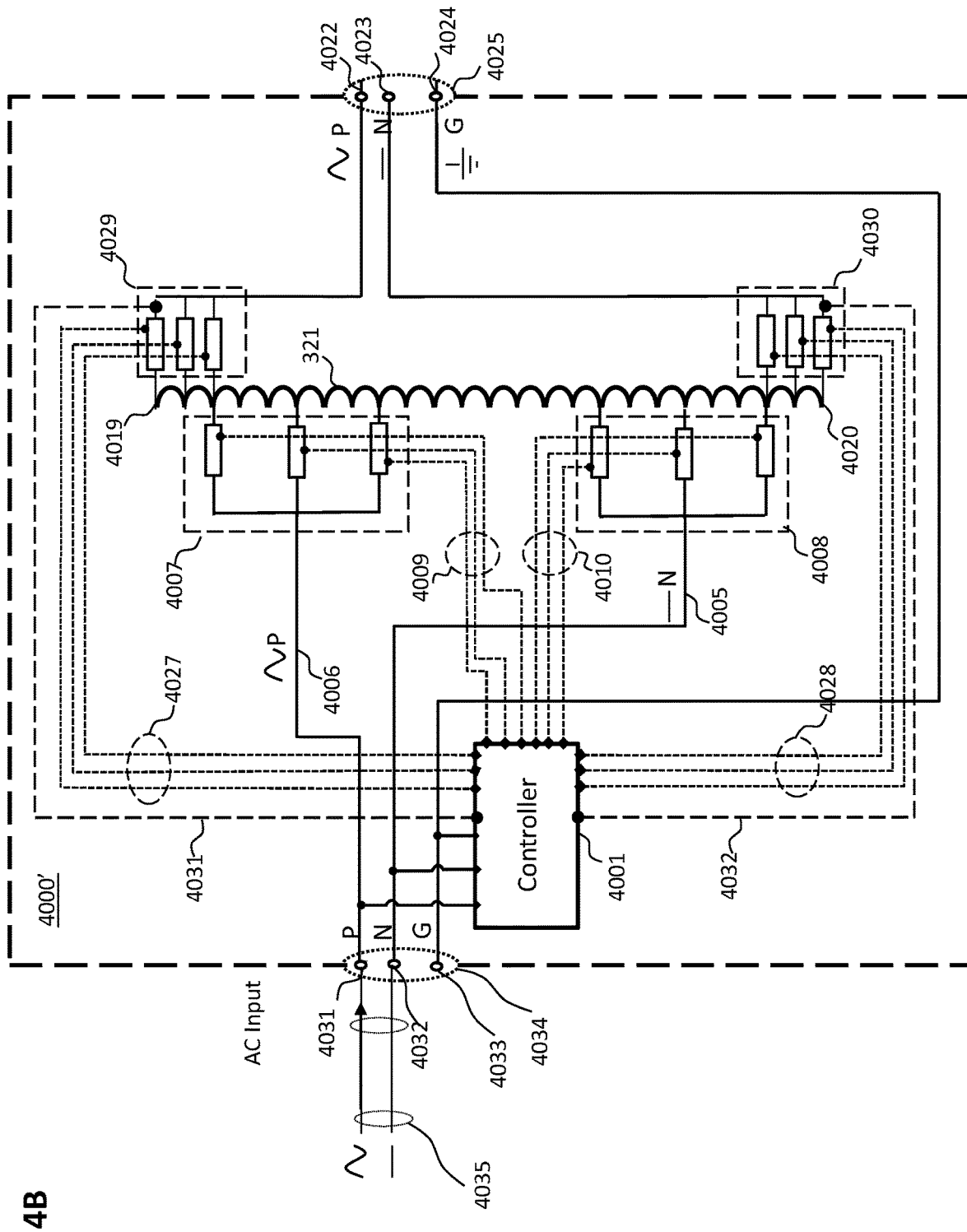
FIG. 4B is a schematic block diagram of the PNVA of FIG. 4A without a ground connection to the input terminal, according to embodiments of the present invention.

Reference is made now also to FIG. 4B, which is a schematic block diagram of PNVA 4000', according to embodiments of the present invention. PNVA 4000' may be similar or the same as PNVA 4000, where the embodiment of FIG. 4B demonstrates use of a PNVA, such as PNVA 4000 when no ground line is connected at the ground input terminal 4033. In such a case, controller 4001 may sense that the input ground connected is floating. Absent a reference ground voltage, controller 4001 may act according to the assumption that the phase voltage drop magnitude equals the neutral parasitic voltage. Accordingly, controller 4001 may set STMS 4007 and/or STMS 4029 to raise output phase voltage at terminal 4022 by half the difference between preset nominal voltage and the phase-to-neutral voltage measured at the input port 4034 between terminal 4031 and terminal 4032 of PNVA 4000', and may set STMS 4008 and/or STMS 4030 to be lowered by the same magnitude, thereby setting the output neutral voltage at terminal 4023 to be as close as possible to a ground voltage level and setting the voltage difference between output phase terminal 4022 and output neutral terminal to nominal voltage.

Figure 4C:
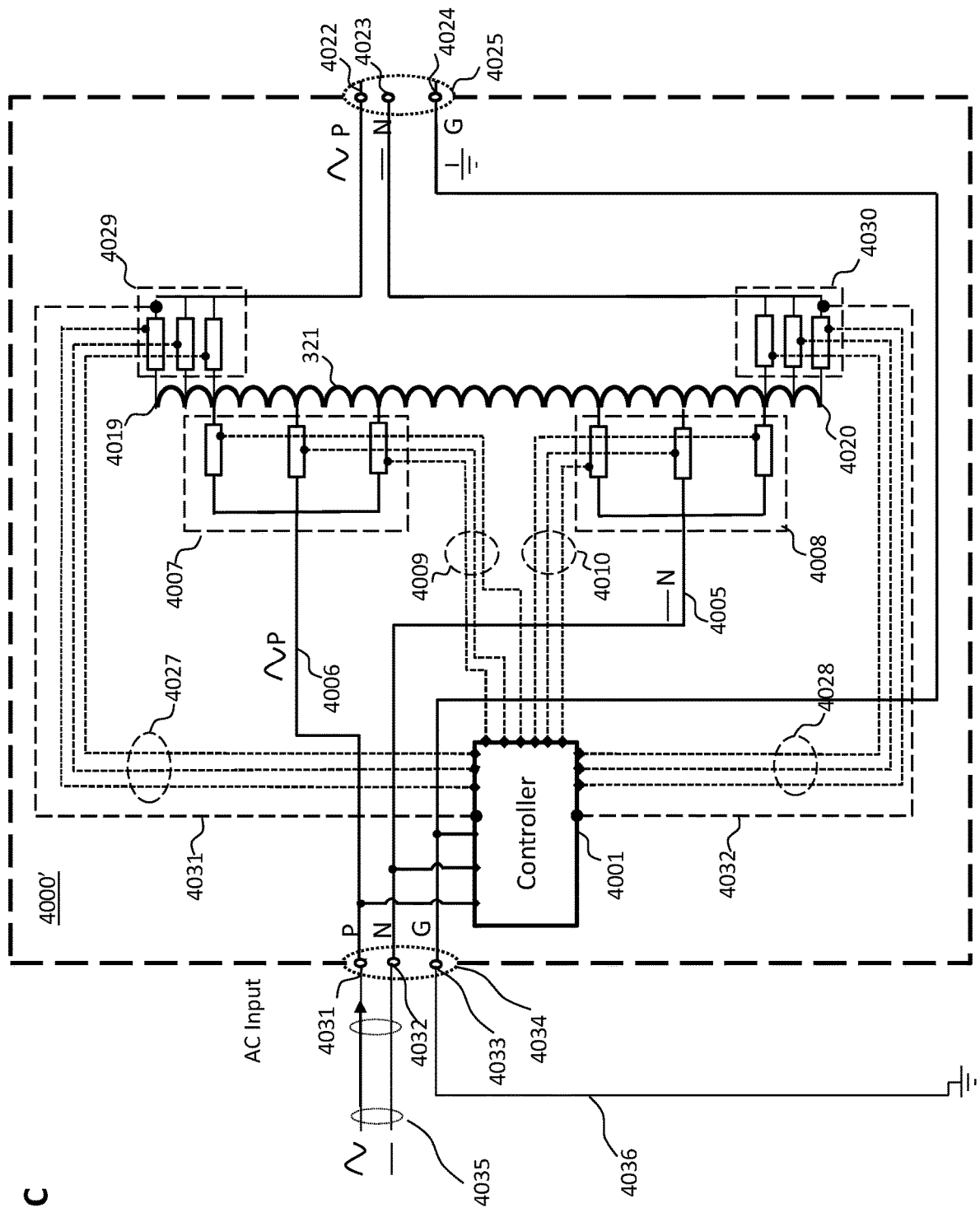
FIG. 4C is a schematic block diagram of the PNVA of FIG. 4A with an local ground connection to the input terminal, according to embodiments of the present invention.

Reference is made now also to FIG. 4C, which is a schematic block diagram of PNVA 4000', according to embodiments of the present invention. PNVA 4000' may be similar or the same as PNVA 4000 of FIG. 4A, differing by having a local ground connection via ground line 4036 connected at ground input terminal 4033. This embodiment is typical for power lines having only two wires, such as coaxial lines.

Figure 5A:
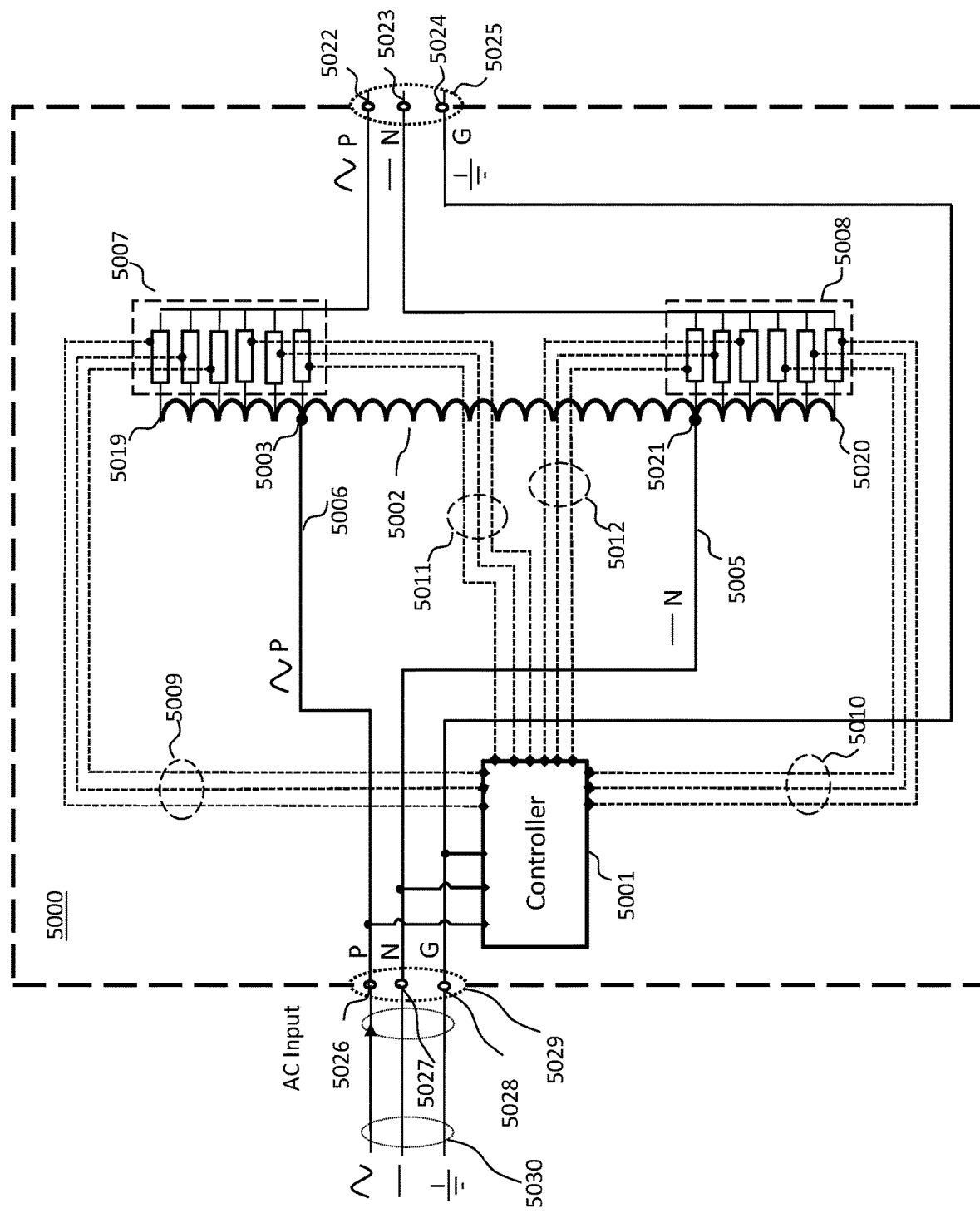
FIG. 5A is a schematic block diagram of an additional PNVA, according to embodiments of the present invention.

Reference is made now to FIG. 5A, which is a schematic block diagram of PNVA 5000, according to embodiments of the present invention. PNVA 5000 may comprise autotransformer 5002, control unit 5001 and two STMSs 5007 and 5008. The embodiment depicted in FIG. 5A demonstrates the use of two DTMSs connected at the secondary side of autotransformer 5002. PNVA 5000 may receive single phase AC power at the distal end of a long electric cable (not shown) at its input port 5029 via input phase terminal 5026 and neutral input terminal 5027, and may further be connected to the ground input terminal 5028. Output port 5025 of PNVA 5000 comprises phase output terminal 5022, neutral output terminal 5023 and ground output terminal 5024. Ground output terminal 5024 may be connected directly to the input ground line. Output phase pin 5022 may be connected to one selectable winding of autotransformer 5002 via STMS 5007, and output neutral pin 5023 may be connected to one selectable winding of autotransformer 5002 via STMS 5008. The input phase line may be permanently connected to winding 5003 of autotransformer 5002, and neutral input line may be permanently connected to winding 5021 of autotransformer 5002. The selection of winding between 5003 to 5019 and between 5020 to 5021 may consider providing sufficient dynamic range for the regulation of voltages of the phase and neutral outputs.

Figure 5B:
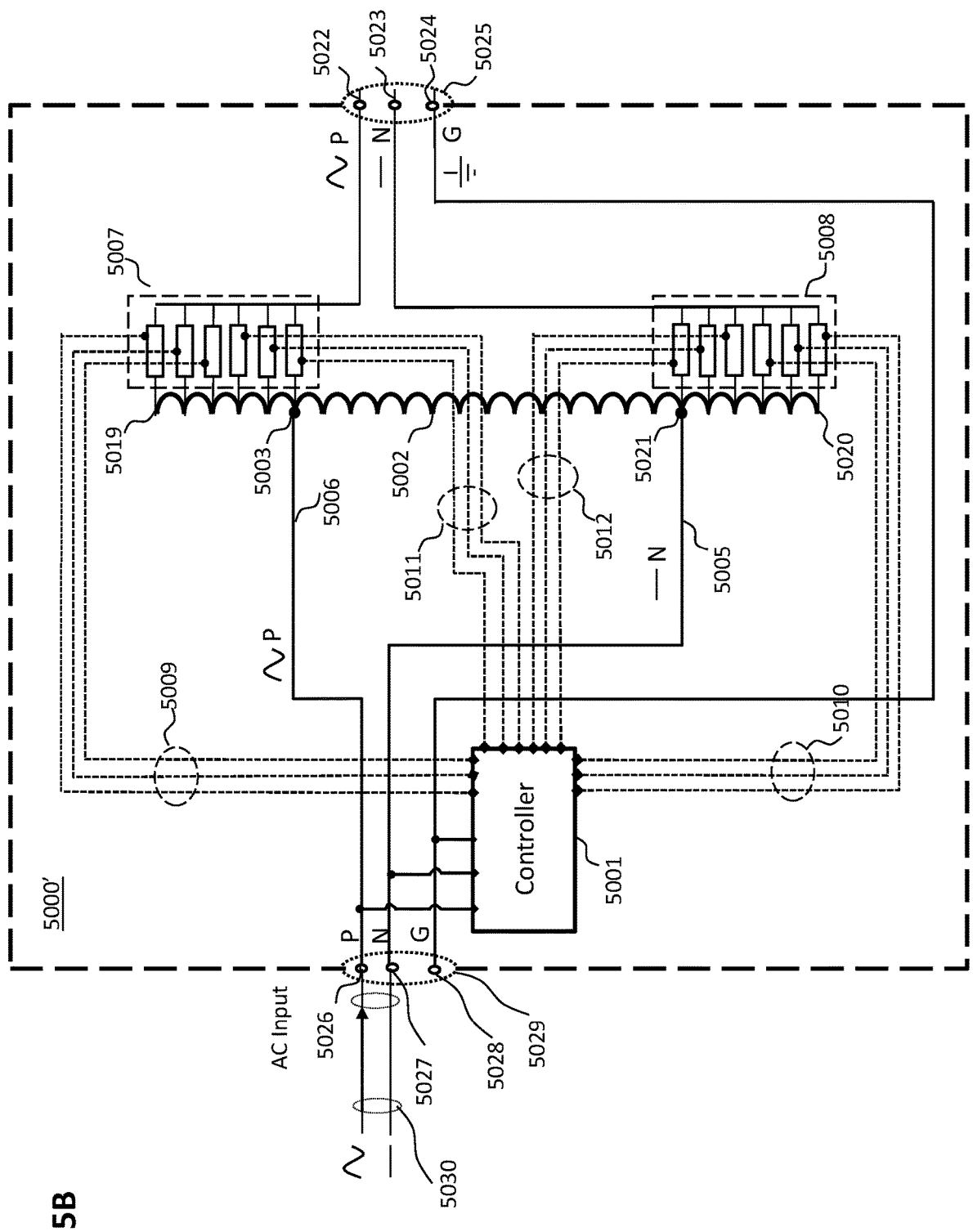
FIG. 5B is a schematic block diagram of the PNVA of FIG. 5A without a ground connection to the input terminal, according to embodiments of the present invention.

Reference is made now also to FIG. 5B, which is a schematic block diagram of PNVA 5000', according to embodiments of the present invention. PNVA 5000' may be similar or the same as PNVA 5000, where the embodiment of FIG. 5B demonstrates use of a PNVA, such as PNVA 5000 when no ground line is connected at the input port 5029, terminal 5028. In such a case, controller 5001 may sense that the input ground connection is floating. Absent a reference ground voltage, controller 5001 may act according to the assumption that the phase voltage drop magnitude equals the neutral parasitic voltage. Accordingly, controller 5001 may set STMS 5007 to raise output phase voltage at terminal 5022 by half the difference between preset nominal phase-neutral voltage and the phase-neutral voltage measured at the input port 5029, terminal 5026 to 5027 of PNVA 5000', and may set STMS 5008 to be lowered by the same magnitude, thereby setting the output neutral voltage at terminal 5023 to as close as possible to a ground voltage level and setting the voltage difference between output phase terminal 5022 and output neutral terminal 5023 to the nominal voltage.

Figure 5C:
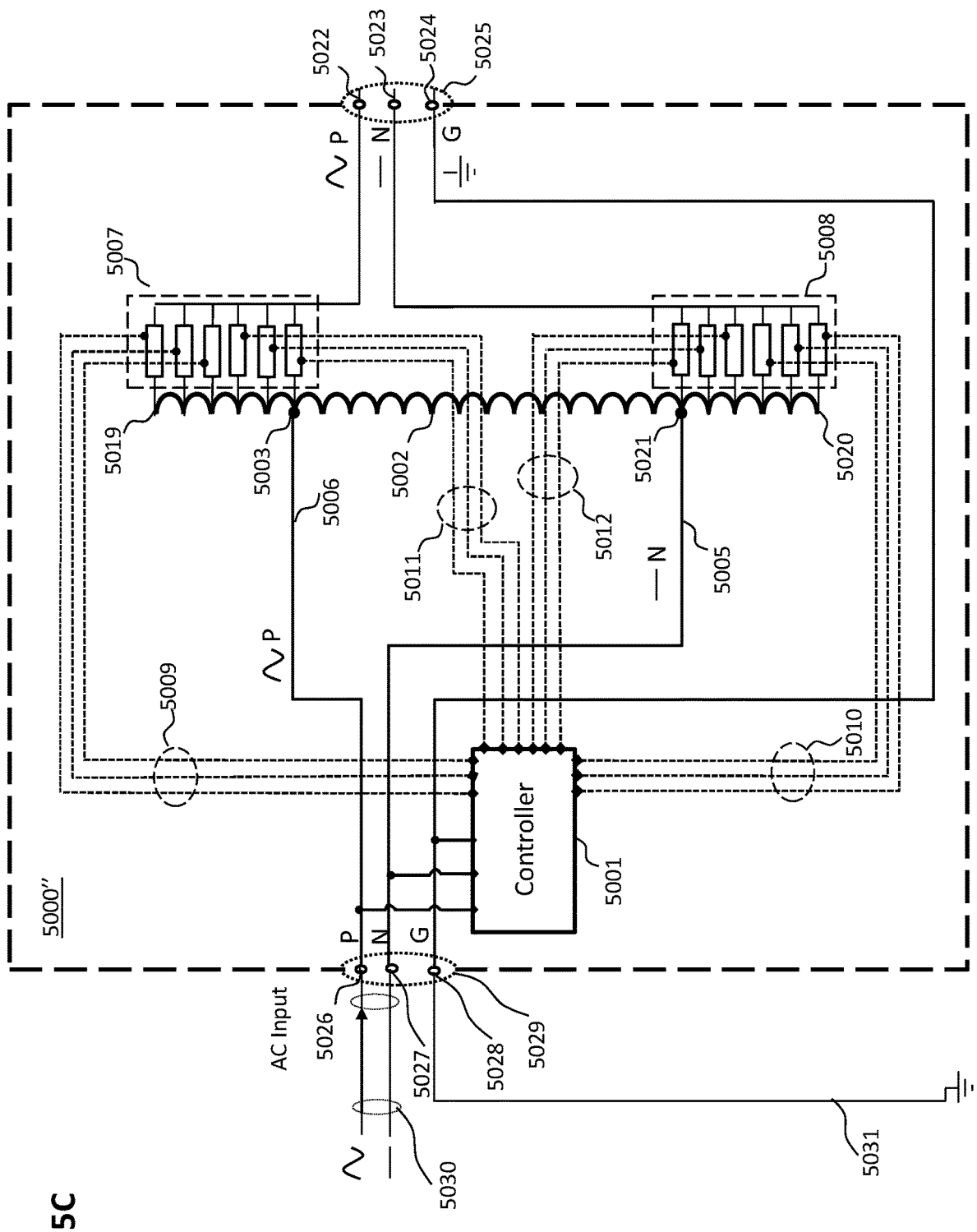
FIG. 5C is a schematic block diagram of the PNVA of FIG. 5A with a local ground connection connected to the input terminal, according to embodiments of the present invention.

Reference is made now also to FIG. 5C, which is a schematic block diagram of PNVA 5000', according to embodiments of the present invention. PNVA 5000' may be similar or the same as PNVA 5000, of FIG. 5D, differing from PNVA 5000 by having a local ground connection connected by ground line 5031 to ground input terminal 5027. This embodiment is typical for power lines having only two wires, such as coaxial lines.

Figure 5D:
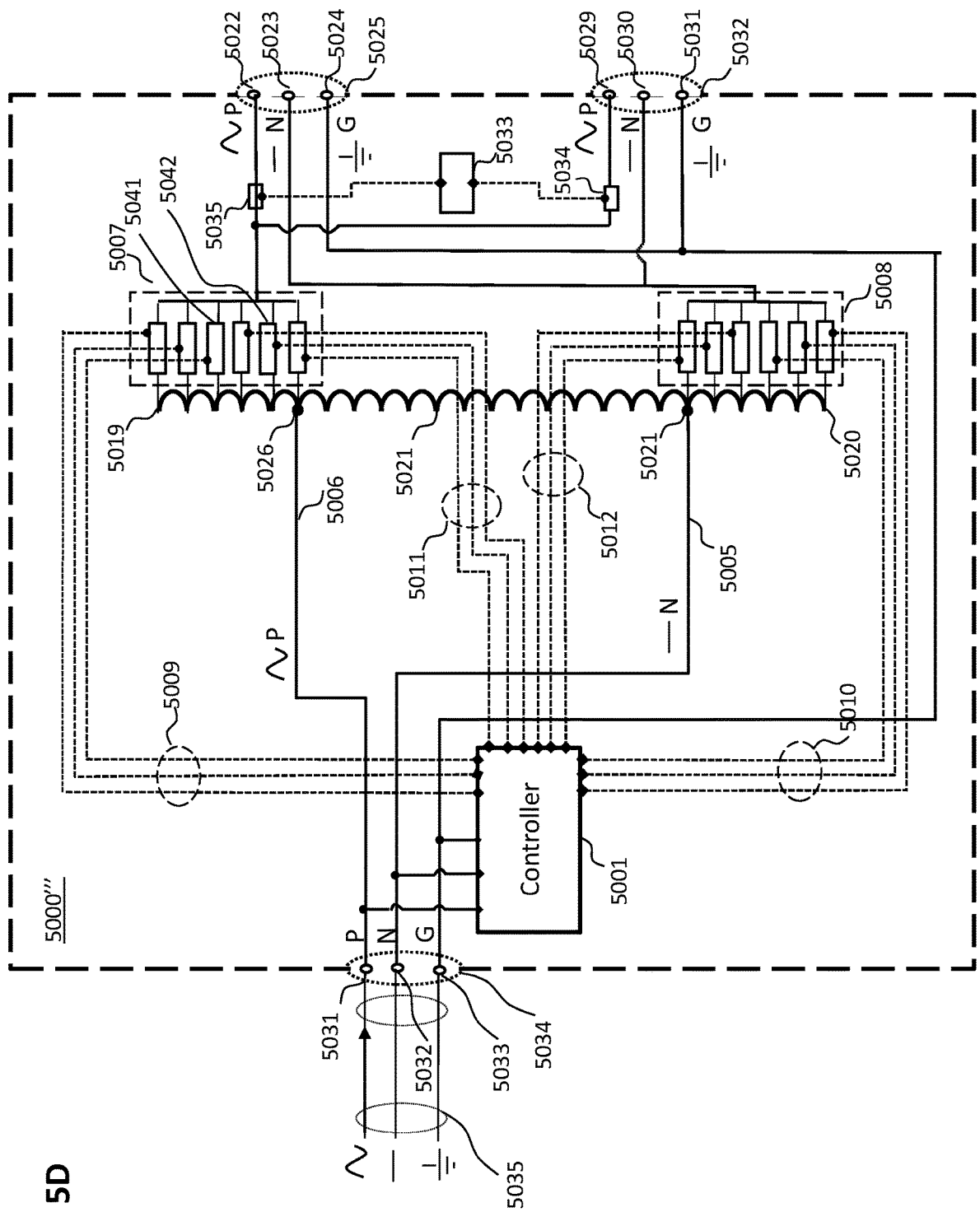
FIG. 5D is a schematic block diagram of the PNVA of FIG. 5A adapted to power two active devices, according to embodiments of the present invention.

Reference is made now also to FIG. 5D, which is a schematic block diagram of PNVA 5000", according to embodiments of the present invention. PNVA 5000" may be similar or the same as PNVA 5000, where the embodiment of FIG. 5C demonstrates providing output regulated phase and neutral voltages to two output ports 5025 and 5032, which may be connected to the secondary side via STMSs 5007 and 5008. The connection of each of output phase terminal 5022 and 5029 to STMS 5007 may controllably be timed by switches 5035 and 5034, respectively, to avoid start up of both outputs simultaneously and thereby to avoid too high inrush current. The timing of connection may be controlled by output timing control unit 5033. In some embodiments, output timing control unit may be embodied as a module in control unit 5001.

Figure 6A:
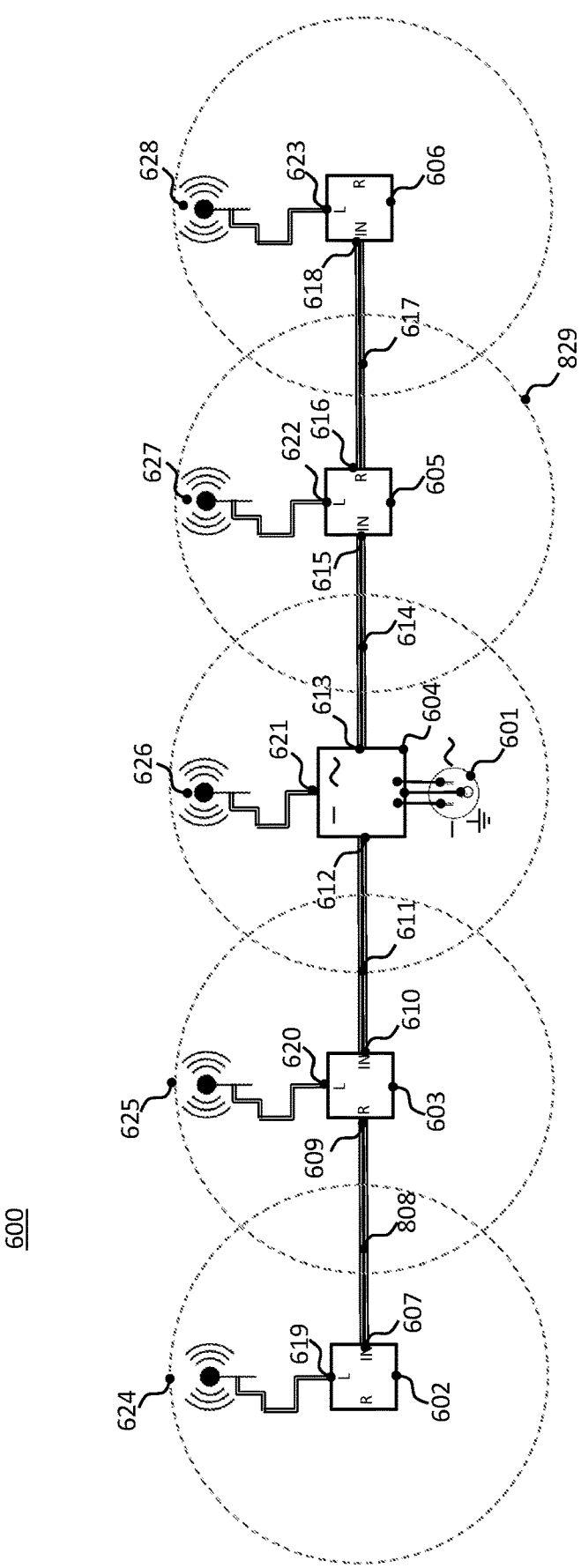
FIG. 6A is a schematic illustration of a chain of two serially connected single phase PNVAs according to embodiments of the present invention.

Reference is made now to FIG. 6A, which is a schematic illustration of chain power system 600 comprising a central AC powering source 601, central powering switch 604 and two serially connected single phase PNVAs, according to embodiments of the present invention. Reference is also made to FIG. 6B, which is a graph depicting the source current during gradual connection of the active devices of serially connected PNVAs of FIG. 6A, according to embodiments of the present invention. Chain 600 comprising two serially connections, right and left to the central powering switch or splitter 604, may receive electric power from central utility AC supply 601 supplying AC power to adjacent LTE transmitter 626 and may provide AC power to remote PNVA 603 and to PNVA 605. PNVA 603 may provide power to PNVA 602, and PNVA 605 may provide power to PNVA 606. Each of PNVAs 602, 603, 605 and 606 may provide regulated phase voltage and about zero voltage level to the ground of the neutral line to the active devices, which are, in the embodiment of FIG. 6A, wireless transmitters 624, 625, 626, 627 and 628, respectively, such as LTE standard wireless transmitters. The lines connecting between the PNVAs are long lines. If all of the active devices will be connected at once to the power source, the inrush current may cause high voltage drops on the long electric lines 608,611,614,617, which in turn may cause difficulties in stabilizing the network and regulating the voltage levels. According to embodiments of the invention, the connection of the various active devices to the AS power line may be done gradually, so as to gradually raise the provided current and thereby decreases the peak current, increase the max total continuous current at the power source and enable PNVA system 600 to gradually regulate the voltages. FIG. 6B depicts the AC source current levels during the power-up of system 600. First transmitter 626 is connected to the local AC power supply 601 via AC splitter/switch 604. Its inrush current is represented by peak point 6002. After settling time, the current stabilizes and sets at point 6003. After a determined (or predetermined) transmitter 625 of PNVA 603 is connected, that causes inrush current to rise to peak point 6005 and then to settle at level 6006. This process may continue by gradually connecting transmitter 624 via PNVA 602, and then transmitter 627 via PNVA 605, and finally transmitter 628 via PNVA 606. At the end of the power-up process, the stabilized current sets at level point 6015. During the power-up process, all of the PNVAs that are providing AC power to their associated transmitter may be required to dynamically operate their STMSs, in order to ensure the output phase and neutral voltages at their output ports are kept within nominal boundaries, as explained hereinabove.

In some embodiments, the progress of the power-up process may depend on signals transmitted from each of the currently powered active device back to previous PNVA in serial, or to a remote central control unit (not shown) to indicate that the current has already stabilized and the next step of connecting additional active device may take place.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A phase and neutral voltage adjusting (PNVA) device comprising a phase AC input terminal, a neutral line input terminal, a ground input terminal, a phase AC output terminal, a neutral line output terminal and a ground output terminal, the device further comprising:
   an autotransformer comprising:
      a plurality of taps each connected to a separate winding of the autotransformer and associated with at least one of an AC phase input terminal of the device and with an AC phase output terminal of the device; and
      a plurality of taps each connected to a separate winding of the autotransformer and associated with at least one of an AC neutral line input terminal of the device and with an AC neutral line output of the device;
   at least one first single-port-to multi-port (STMS) controllable selector switch associated with adjusting the phase AC output voltage;
   at least one second single-port-to multi-port (STMS) controllable selector switch associated with adjusting the neutral output voltage; and
   a controller adapted to provide control signals for activating each of the at least one STMS of the AC output and the at least one STMS associated with the neutral output;
   wherein each of the at least one first STMS and at least one of the second STMS is adapted to connect the respective single port to a selected respective port of the multiple ports in response to a control signal from a controller.

2. The device of claim 1, wherein the controller is configured to respond to a signal indicative of the voltage between the AC phase input terminal and the neutral input terminal and to a signal indicative of the voltage between the neutral input terminal and the ground output terminal.

3. The device of claim 2, wherein the controller is further configured to issue a first control signal to the at least one first STMS in response to the signal indicative of the voltage between the AC phase input terminal and the neutral line input terminal and to issue a second control signal to the at least one second STMS in response to the voltage between the neutral line input terminal and the ground output terminal.

4. The device of claim 2, wherein the first control signal is configured to select one of the multi ports of the at least one first STMS to be connected to the respective single port and the second control signal is configured to select one of the multi ports of the at least one second STMS to be connected to the respective single port.

5. The device of claim 1 wherein:
the single port of the one of the at least one first STMS is connected to the phase AC input terminal and the respective multi ports are connected each to one tap of the plurality of taps of the autotransformer; and
the single port of the one of the at least one second STMS is connected to the neutral line input terminal and the respective multi ports are connected each to one tap of the plurality of taps of the autotransformer, and
wherein each of the taps connected to the second STMS is different from the taps connected to the first STMS.

6. The device of claim 5 wherein:
the one port of the multi ports of the at least one first STMS is selected to set the voltage between the AC phase output terminal and the neutral output terminal port to a nominal line voltage; and
the one port of the multi ports of the at least one second STMS is selected to set the voltage between the neutral output port and the ground output port to substantially zero.

7. A method for canceling parasite voltage on neutral electric line and lifting of voltage of phase line a remote load, the method comprising:
providing a phase and neutral voltage adjusting (PNVA) device comprising phase AC input terminal, neutral line input terminal, ground input terminal, phase AC output terminal, neutral line output terminal and ground output terminal, the device further comprising:
an autotransformer comprising:
plurality of taps connected each to a separate winding of the autotransformer and associated with at least one of an AC phase input terminal of the device and with an AC phase output of the device; and
a plurality of taps connected each to a separate winding of the autotransformer and associated with at least one of an AC neutral line input terminal of the device and with an AC neutral line output of the device;
at least one first single-port-to multi-port (STMS) controllable selector switch associated with adjusting the phase AC output voltage;
at least one second single-port-to multi-port (STMS) controllable selector switch associated with adjusting the neutral output voltage; and
a controller adapted to provide control signals for activating each of the at least one STMS of the AC output and the at least one STMS associated with the neutral output;
wherein each of the at least one first STMS and at least one of the second STMS is adapted to connect the respective single port to a selected respective port of the multiple ports in response to a control signal from a controller;
receiving, by the controller, a signal indicative of the voltage between the AC phase input terminal and the neutral line input terminal and a signal indicative of the voltage between the neutral line input terminal and the ground output terminal; and
issuing a first control signal to the at least one first STMS in response to the signal indicative of the voltage between the AC phase input terminal and the neutral line input terminal and issuing a second control signal to the at least one second STMS in response to the voltage between the neutral line input terminal and the ground output terminal.

8. The method of claim 7, further comprising
selecting one of the multi ports of the at least one first STMS, in response to the first control signal, to be connected to the respective single port; and
selecting one of the multi ports of the at least one second STMS, in response to the second control signal, to be connected to the respective single port.

9. The method of claim 8, wherein:
the one port of the multi ports of the at least one second STMS is selected to set the voltage between the neutral line output port and the ground output port to substantially zero; and
the one port of the multi ports of the at least one first STMS is selected to set the voltage between the AC phase output port and the neutral line output port to a nominal line voltage.

* * * * *